(12) United States Patent
Johansson et al.

(10) Patent No.: US 9,712,191 B2
(45) Date of Patent: Jul. 18, 2017

(54) APPARATUS AND METHOD FOR USE WITH ANTENNA ARRAY

(75) Inventors: Bernt Johansson, Värmdö (SE); Bo Berglund, Uppsala (SE)

(73) Assignee: TELEFONAKTIEBOLAGET L M ERICSSON, Stockholm (SE)

( * ) Notice: Subject to any disclaimer, the term of this patent is extended or adjusted under 35 U.S.C. 154(b) by 16 days.

(21) Appl. No.: 14/348,937

(22) PCT Filed: Oct. 7, 2011

(86) PCT No.: PCT/EP2011/067607
§ 371 (c)(1),
(2), (4) Date: Apr. 1, 2014

(87) PCT Pub. No.: WO2013/050085
PCT Pub. Date: Apr. 11, 2013

(65) Prior Publication Data
US 2014/0248843 A1    Sep. 4, 2014

(51) Int. Cl.
*H04B 1/04* (2006.01)
*H04B 1/02* (2006.01)
*H01Q 3/26* (2006.01)

(52) U.S. Cl.
CPC ......... *H04B 1/0458* (2013.01); *H01Q 3/2605* (2013.01); *H01Q 3/267* (2013.01); *H04B 1/0483* (2013.01); *H04B 2001/045* (2013.01)

(58) Field of Classification Search
CPC ................ H04B 1/0458; H04B 1/0483; H04B 2001/045; H04B 7/0615; H04B 7/0845;
(Continued)

(56) References Cited

U.S. PATENT DOCUMENTS 6,091,934 A * 7/2000 Berman et al. .............. 455/13.4
6,157,343 A * 12/2000 Andersson et al. .......... 342/371
(Continued)

FOREIGN PATENT DOCUMENTS

EP    1 583 174 A2    10/2005
EP    1 724 875 A1    11/2006
(Continued)

OTHER PUBLICATIONS

International Search Report for International Application No. PCT/EP2011/067607, Aug. 7, 2012.

*Primary Examiner* — Pablo Tran
(74) *Attorney, Agent, or Firm* — Patents on Demand P.A.; Brian K. Buchheit; Scott M. Garrett

(57) ABSTRACT

Embodiments of the present invention provide an apparatus (200) for feeding an antenna array (207) comprising at least first and second antenna elements ($207_1$, $207_2$). The apparatus comprises a first transmitting element ($201_1$) configured to receive a first base band signal ($202\text{-}i$) and to feed a first feed signal ($204_1$) to a first antenna element ($207_1$), the first transmitting element ($201_1$) comprising a first power amplifier ($203_1$). The apparatus also comprises a second transmitting element ($201_2$) configured to receive a second base band signal ($202_2$) and to feed a second feed signal ($204_2$) to a second antenna element ($207_2$), the second transmitting element ($201_2$) comprising a second power amplifier ($203_2$). A tapering control unit (205) is adapted to provide a tapering function between the first feed signal to the first antenna element and the second feed signal to the second antenna element.

15 Claims, 6 Drawing Sheets

(58) Field of Classification Search
CPC .. H04B 7/0857; H04B 7/0617; H04B 7/0669; H01Q 3/2605; H01Q 3/267; H01Q 3/28; H03G 3/3042; H03G 3/3089; H04W 52/42; H04L 27/2601
See application file for complete search history.

(56) References Cited

U.S. PATENT DOCUMENTS

| | | | |
|---|---|---|---|
| 6,646,600 B2* | 11/2003 | Vail et al. | 342/372 |
| 6,684,064 B2* | 1/2004 | Kazakevich et al. | 455/126 |
| 6,871,049 B2* | 3/2005 | Sugar et al. | 455/103 |
| 6,993,299 B2* | 1/2006 | Sugar et al. | 455/103 |
| 7,106,249 B2* | 9/2006 | Kubo et al. | 342/174 |
| 7,248,216 B2* | 7/2007 | Akiyama et al. | 342/368 |
| 7,409,191 B2* | 8/2008 | Azuma | 455/103 |
| 7,899,414 B2* | 3/2011 | Sugar et al. | 455/103 |
| 7,957,710 B2* | 6/2011 | Kawamoto et al. | 455/127.1 |
| 2002/0147032 A1* | 10/2002 | Yoon et al. | 455/562 |
| 2003/0142012 A1* | 7/2003 | Hirabe | 342/173 |
| 2010/0254299 A1 | 10/2010 | Kenington | |

FOREIGN PATENT DOCUMENTS

| | | |
|---|---|---|
| WO | WO 95/34103 | 12/1995 |
| WO | WO 03/081768 A2 | 10/2003 |

\* cited by examiner

APPARATUS AND METHOD FOR USE WITH ANTENNA ARRAY

PRIORITY

This nonprovisional application is a U.S. National Stage Filing under 35 U.S.C. §371 of International Patent Application Serial No. PCT/EP2011/067607, filed Oct. 7, 2011 and entitled "Apparatus and Method For Use With Antenna Array".

TECHNICAL FIELD

The invention relates to an apparatus and method for use with an antenna array, and in particular to an apparatus and method for providing a tapering function in an antenna array.

BACKGROUND

FIG. 1 shows a typical column antenna 101 for use in mobile communication systems. The column antenna 101 comprises a plurality of antenna elements $103_1$ to $103_N$ that are connected by means of a fixed or passive tapering network 105. The tapering network 105 is fed from a transmitter 107. The transmitter 107 comprises a power amplifier 109 that receives a signal that is to be transmitted from a transmitter processing circuit 111, which in turn receives the signal to be transmitted from base band processing unit 113. The power amplifier is biased by a bias control circuit 117, which is supplied by a fixed DC voltage 119. The function of the tapering network 105 is to feed each antenna element $103_1$ to $103_N$ with the same or different amplitudes and/or phases in order to shape the combined antenna beam that is emitted by the column antenna 101.

A disadvantage of using such a tapering function in a column antenna 101 is that energy losses will occur in the passive components and transmission lines that constitute the tapering network 105, thus degrading power efficiency.

A further disadvantage is that the tapering function of the passive tapering network 105 is fixed, which does not therefore allow individual amplitude settings per antenna element to be changed during runtime without decreasing power efficiency, particularly over wide power ranges.

Yet another disadvantage is that, when adjusting the phases for each antenna element in traditional antenna systems, analogue phase shifting circuits are required. Such analogue phase shifting circuits tend to be inaccurate, and it is therefore difficult to ascertain how accurate the output signal correlates to a desired value.

SUMMARY

It is an aim of embodiments of the present invention to provide an apparatus and method for use with an antenna array, that obviate or reduce at least one or more of the disadvantages mentioned above.

According to a first aspect of the invention there is provided an apparatus for feeding an antenna array comprising at least first and second antenna elements. The apparatus comprises a first transmitting element configured to receive a first base band signal and to feed a first feed signal to a first antenna element, the first transmitting element comprising a first power amplifier. The apparatus also comprises a second transmitting element configured to receive a second base band signal and to feed a second feed signal to a second antenna element, the second transmitting element comprising a second power amplifier. The apparatus also comprises a tapering control unit adapted to provide a tapering function between the first feed signal to the first antenna element and the second feed signal to the second antenna element.

According to another aspect of the invention, there is provided a method of providing a tapering function in an antenna array (207) comprising at least first and second antenna elements ($207_1$, $207_2$). The method comprises the steps of: amplifying a first base band signal using a first transmitting element comprising a first power amplifier, to provide a first feed signal for a first antenna element; amplifying a second base band signal using a second transmitting element comprising a second power amplifier, to provide a second feed signal for a second antenna element; and providing a tapering function between the first feed signal to the first antenna element and the second feed signal to the second antenna element.

BRIEF DESCRIPTION OF THE DRAWINGS

For a better understanding of the present invention, and to show more clearly how it may be carried into effect, reference will now be made, by way of example only, to the following drawings in which.

DETAILED DESCRIPTION

The embodiments below will be described in relation to a column antenna having a plurality of antenna elements. It is noted, however, that the embodiments of the invention can be used with any form of antenna array that comprises at least first and second antenna elements including, but not limited to, an antenna matrix having a plurality of antenna elements. It is noted that each antenna element may itself comprise an antenna sub-array comprising a plurality of individual antenna elements.

Figure 1:
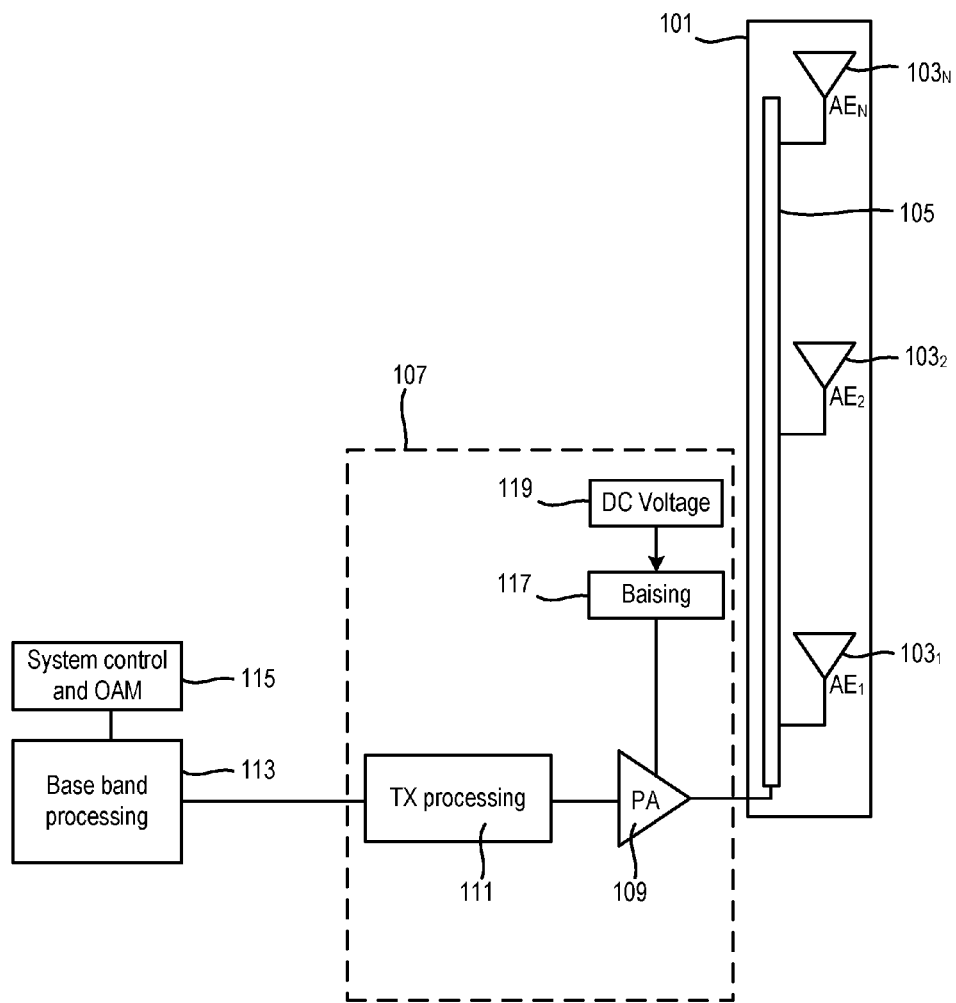
FIG. 1 shows a column antenna according to the prior art.
Figure 2:
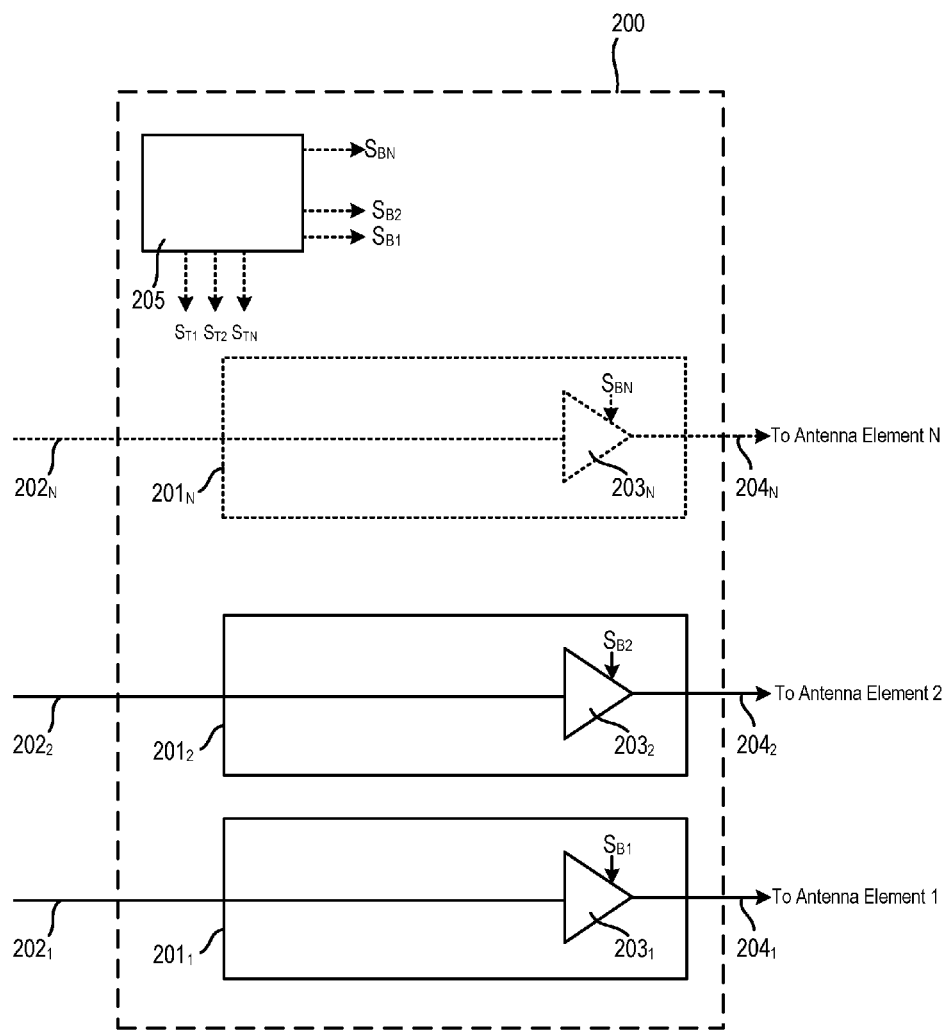
FIG. 2 shows an apparatus according to a first embodiment of the present invention.

FIG. 2 schematically illustrates an apparatus 200 according to an embodiment of the present invention, for feeding an antenna array comprising at least first and second antenna elements (not shown). A first transmitting element ($201_1$) comprises a first power amplifier ($203_1$), and is configured to receive a first base band signal $202_1$, and feed a first feed signal $204_1$ to a first antenna element (not shown). A second transmitting element ($201_2$) comprises a second power amplifier ($203_2$), and is configured to receive a second base band signal $202_2$, and feed a second feed signal $204_2$ to a second antenna element (not shown). A tapering control unit 205 is adapted to provide a tapering function between the first feed signal to the first antenna element and the second feed signal to the second antenna element.

Since separate transmitting elements are provided, it will be appreciated that the embodiment of FIG. 2 has the advantage of enabling any tapering function to be provided between the first feed signal and the second feed signal. The tapering function may be configured according to a particular application of an antenna array, and may be configured for one type of tapering function and/or dynamically configured during use, for example when the apparatus is required to perform a different tapering function.

As will be described in greater detail below, according to one aspect the tapering control unit 205 may be adapted to provide first and second control signals $S_{B1}$, $S_{B2}$ for individually controlling bias settings of the first power amplifier $203_1$ and the second power amplifier $203_2$, respectively, according to the tapering function provided between the first feed signal to the first antenna element and the second feed signal to the second antenna element.

The controlling of the bias settings may comprise controlling the supply voltage provided to a power amplifier 203, such that the power supply fits the power capability need created by the tapering function. A high power capability requires a high supply voltage, and vice versa. In this way, the bias settings of a power amplifier can be adaptively controlled to match the particular needs of a particular tapering function, thereby having the advantage of improved power efficiency.

According to a second aspect, also described in greater detail below, the tapering control unit 205 may be adapted to control a tapering function by controlling signals at the base band level. This may comprise providing a first multiplier unit (not shown) in the path of the first base band signal $202_1$ and a second multiplier unit (not shown) in the path of the second base band signal $202_2$, wherein the first multiplier unit and the second multiplier unit are controlled by the tapering control unit 205, and configured to adjust the amplitude and/or phase of the first base band signal $202_1$ and the second base band signal $202_2$, respectively, to provide the required tapering function between the first feed signal $204_1$ to the first antenna element and the second feed signal $204_2$ to the second antenna element.

As such, the tapering function may be created at a base band level which couples a stream of user data to the first and second transmitting elements $201_1$, $201_2$. The tapering function may be provided by multiplying a stream of user data by different weighted values, for example. The tapering function may involve adjusting the amplitude and/or phase characteristics of the feed signal for a given antenna element.

It is noted that other methods of introducing a tapering function between the first and second antenna elements are intended to be encompassed by the embodiments of the present invention.

It is also noted that the apparatus 200 may comprise more than first and second transmitting elements. For example, the apparatus 200 may comprises N transmitting elements $201_1$ to $201_N$ for feeding a feed signal to each of N antenna elements (not shown), where N is greater than or equal to two. Such an apparatus 200 also comprises a tapering control unit 205 that is arranged to provide N control signals $S_{B1}$ to $S_{BN}$ for each of the N transmitting elements $201_1$ to $201_N$.

As noted above, the N transmitting elements $201_1$ to $201_N$ each comprise a power amplifier $203_1$ to $203_N$. The tapering control unit 205 is adapted to provide at least first and second control signals $S_{B1}$ to $S_{BN}$ to control the bias settings of the respective power amplifiers $203_1$ to $203_N$ according to the tapering function that is being provided between the feed signals sent to the N antenna elements, thereby optimizing the efficiency of each power amplifier based on the tapering function created at base band.

This has the advantage of enabling the bias settings of each power amplifier to be adjusted separately to fit the tapering function created at base band. As such, the power capability and power efficiency of each amplifier can be adapted according to the tapering function created at baseband. The adjustment of the bias level lowers the supply power to the power amplifier based on the output power capability required from the power amplifier, thus increasing power efficiency.

According to one embodiment, the power capability of the power amplifier can be regulated between a maximum and a minimum value. For high output power capability the power amplifier requires more power supply, and vice versa.

The embodiment of FIG. 2 also has the advantage of enabling a tapering function to be adjusted dynamically during use, and the bias levels of each power amplifier controlled dynamically according to a particular tapering function, in order to obtain optimum efficiency in the power amplifiers.

Figure 3:
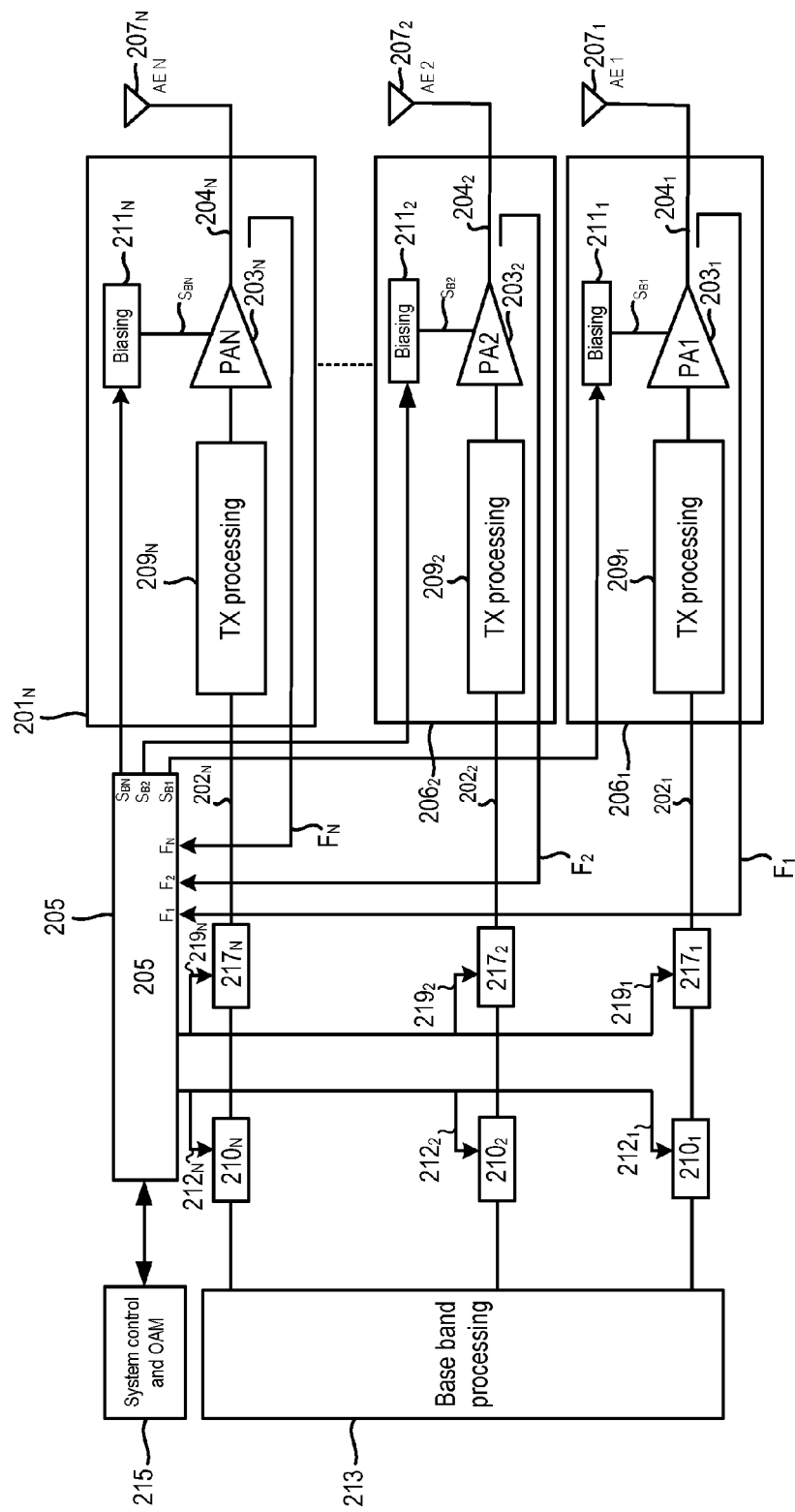
FIG. 3 shows an apparatus according to another embodiment of the present invention.

FIG. 3 schematically illustrates an apparatus according to another embodiment of the present invention. As in FIG. 2, FIG. 3 illustrates an apparatus for feeding an antenna array comprising N antenna elements $207_1$ to $207_N$, where N is greater than or equal to two. The apparatus comprises N transmitting elements $201_1$ to $201_N$ coupled to receive base band signals $202_1$ to $202_N$ from a base band processing circuit 213, and for feeding feed signals $204_1$ to $204_N$ to the respective N antenna elements $207_1$ to $207_N$.

The apparatus also comprises a tapering control unit 205, for providing control signals $S_{BS}$ to $S_{BN}$ for each of the N transmitting elements $201_1$ to $201_N$ in order to control the bias settings of respective power amplifiers according to a tapering function created as base band between the N antenna elements.

The tapering control unit 205 is connected to a system control and operations, administration and maintenance (OAM) unit 215. As such, the tapering control unit 205, which controls the N transmitting elements $201_1$ to $201_N$, is in turn controlled by one or more signals received from the OAM system, which may be an OAM system of a mobile communications system.

Each transmitting element $201_1$ to $201_N$ is therefore coupled to receive a respective signal flow (or stream of user data) from a base band processing block 213 (referred to as the base band signals $202_1$ to $202_N$), and arranged to provide an input signal, (referred to as the feed signal $204_1$ to $204_N$) for each respective transmitting element. A tapering function is therefore provided between the feed signals for the respective transmitting elements, by introducing a tapering function at base band. For example, multiplier units $210_1$ to $210_N$ can be provided in the path of the base band signals $202_1$ to $202_N$, for introducing the tapering coefficients corresponding to phase and/or amplitude that are needed to provide the required tapering function. The multiplier units $210_1$ to $210_N$ are controlled by control signals $212_1$ to $212_N$ received from the tapering control unit 205.

Each transmitting element $201_1$ to $201_N$ comprises a transmitting processor $209_1$ to $209_N$, which receives a base band signal $202_1$ to $202_N$ from the base band processing block 213. Each transmitting processor $209_1$ to $209_N$ up-converts the respective base band signal $202_1$ to $202_N$ received from the base band processing block 213 to RF level, for transmission to the antenna elements $207_1$ to $207_N$.

Each transmitting element $201_1$ to $201_N$ comprises an RF power amplifier (PA), $203_1$ to $203_N$. The RF power amplifiers $203_1$ to $203_N$ are arranged to amplify the signals from the transmitting processors $209_1$ to $209_N$ that have been up-converted to RF level, to a required RF output level. The operating point and maximum power capability of the RF power amplifiers $203_1$ to $203_N$ can be individually controlled by changing bias settings of the power amplifiers $203_1$ to $203_N$, according to a tapering function provided between the feed signals $204_1$ to $204_N$ to the antenna elements $207_1$ to $207_N$, thus providing optimal RF energy efficiency.

The bias settings of the power amplifiers $203_1$ to $203_N$ are controlled by a respective biasing unit $211_1$ to $211_N$, each biasing unit $211_1$ to $211_N$ being controlled by control signals $S_{B1}$ to $S_{BN}$ received from the tapering control unit 205. The biasing units $211_1$ to $211_N$ are therefore arranged to control the bias settings of the power amplifiers $203_1$ to $203_N$ based on the respective received control signals. Although FIG. 3 shows separate biasing units $211_1$ to $211_N$ being provided for controlling the bias settings of the respective power amplifiers, it is noted that an alternative embodiment may comprise one central biasing unit that is configured to provide biasing signals to each individual power amplifier. The operating point and power capability of each power amplifier is changed by changing the bias of the power amplifier transistors. The controlling of the bias settings may comprise controlling a supply voltage provided to a power amplifier $203_1$ to $203_N$, such that the power supply fits the power capability need created by the tapering function. A high power capability requires a high supply voltage, and vice versa. In this way, the bias settings of a power amplifier can be adaptively controlled to match the particular needs of a particular tapering function, thereby having the advantage of improved power efficiency.

In operation, the tapering settings are determined by the system control and OAM unit 215 and used to create a tapering function at the base band level, under control of the tapering control unit 205 and the multiplier units $210_1$ to $210_N$. Furthermore, the tapering settings determined by the system control and OAM unit 215 can be converted into bias level values before being received by the tapering control unit 205. Alternatively, the bias level values may be determined by the tapering control unit 205 itself.

The tapering control unit 205 then generates the control signals $S_{B1}$ to $S_{BN}$ based on the bias settings such that the operating point and/or power capability of each power amplifier can be controlled according to the tapering function to be provided between the feed signals to the N antenna elements.

The control signals $S_{B1}$ to $S_{BN}$ are transmitted to the biasing units $211_1$ to $211_N$, which control the bias of each of the respective power amplifiers $203_1$ to $203_N$ according to the control signal values The biasing units $211_1$ to $211_N$ enable a stable control to be provided, and can store values corresponding to the required bias settings, which are updated periodically by the tapering control unit 205. In this manner the biasing units $211_1$ to $211_N$ can be adapted to start from predefined fail safe default values, which are then adjusted during use according to a particular tapering function, under control of the tapering control unit 205. This has the advantage of providing a stable control, and does not depend on external signals.

By controlling the bias network for the power amplifiers by means of an OAM system, with preferably digital representation of the values for each power amplifier's bias network, it is thus possible to control the power amplifiers connected to the antenna elements and still maintain power efficiency. Due to the individual control of each power amplifier, it is possible to set an arbitrary tapering function. This has the advantage of enabling the tapering function to be adapted without making any physical changes to passive components, and as such can even be dynamically adapted during operation. It is also possible to regulate the overall RF output power capability from $P_{min}$ to $P_{max}$ without affecting the tapering function or the RF power efficiency.

The embodiment of FIG. 3 can also be adapted to operate in a calibration mode of operation. This option enables the circuit to be fine tuned to take account of the actual gains and/or phase shifts of the respective power amplifiers (and the transmission lines connecting the power amplifiers to the antenna elements), and take account of device mismatch between the different power amplifiers, or offsets caused by factors such as temperature changes.

For this purpose N adders $217_1$ to $217_N$ may be provided in the input signal path between the base band processing block 213 and the transmitting processing units $209_1$ to $209_N$. The N adders $217_1$ to $217_N$ are shown as being coupled between the multiplier units $210_1$ to $210_N$ and the transmitting processors $209_1$ to $209_N$. Alternatively, the N adders $217_1$ to $217_N$ may be provided between the base band processing unit 213 and the multiplier units $210_1$ to $210_N$. In a calibration mode, the adders $217_1$ to $217_N$ may be arranged to add a calibration signal $219_1$ to $219_N$ to the signals from the multiplier units $210_1$ to $210_N$ or base band processing unit 213, to provide base band signals $202_1$ to $202_N$ to the transmitting elements $201_1$ to $201_N$. The calibration signals $219_1$ to $219_N$ are generated by the tapering control unit 205.

According to one embodiment, the calibration signals are added to the base band signals in order to calibrate the system during runtime so that the tapering function can be continuously calibrated. As an alternative, or in addition to this, it may also be possible to replace the normal signal flow with the calibration signal in a more semi-permanent calibration mode. However, it is noted that carrying out the calibration during runtime has the advantage of enabling parameters that change over time to be tracked during runtime (whereas the "off-line" calibration mode has the disadvantage of blocking a signalling path involved in the calibration operation).

As can be seen in FIG. 3, feedback signals $F_1$ to $F_N$ are provided from the transmitting elements $201_1$ to $201_N$ to the tapering control unit 205. The feedback signals are provided from a coupler downstream of the output of the power amplifiers $203_1$ to $203_N$. It should be noted that the feedback signals may, or may not be coupled directly from the output of the power amplifiers $203_1$ to $203_N$. Each of the feedback signals is input into the tapering control unit 205.

In the tapering control unit 205, the feedback signals $F_1$ to $F_N$ are compared with the input feed signals that are input into the transmitting elements during the calibration mode, i.e. the input feed signals that include calibration signals, in order to regulate the power amplifiers $203_1$ to $203_N$. This forms a type of closed loop control algorithm. The regulating of the power amplifiers $203_1$ to $203_N$ may comprise regulating the gain values of the power amplifiers. The calibration signals can be used to control the transmitter gain and/or a phase response. The response is controlled at base band. The power amplifier gain/phase response is however dependant on the bias settings, and thus there is a need for fine tuning control to be provided by the calibration as the bias settings are controlled from a tapering perspective. It can therefore be seen that the calibration signals $219_1$ to $219_N$ can be used to determine a difference between a wanted signal and an observed signal, which is then used as an error signal in the closed loop algorithm for regulation of the transmitter gain and/or phase response. It is noted that the reference to "transmitter" includes the complete transmitting function, including the power amplifier, possible passive components such as an isolator, coupler or transmit filter, plus transmission lines for interconnecting these devices and their interconnection to the antenna elements.

Therefore, as can be seen from above, the calibration signals $219_1$ to $219_N$, which are known or predetermined calibration signals, may be inserted in runtime into the signal flow by means of the adder blocks $217_1$ to $217_N$ in order to regulate the transmitter gain and/or phase response.

It is noted that, if the required accuracy in the gain or bias settings of the power amplifiers can be achieved without the feedback loop, or if device mismatch or parameter changes during runtime are not significant, the calibration signal and feedback loop need not be provided.

If necessary, phase adjustment can be performed on the base band signal for each of the N transmitter chains of for the N antenna elements $207_1$ to $207_N$. The phase adjustment is provided as part of the required tapering function.

Figure 4:
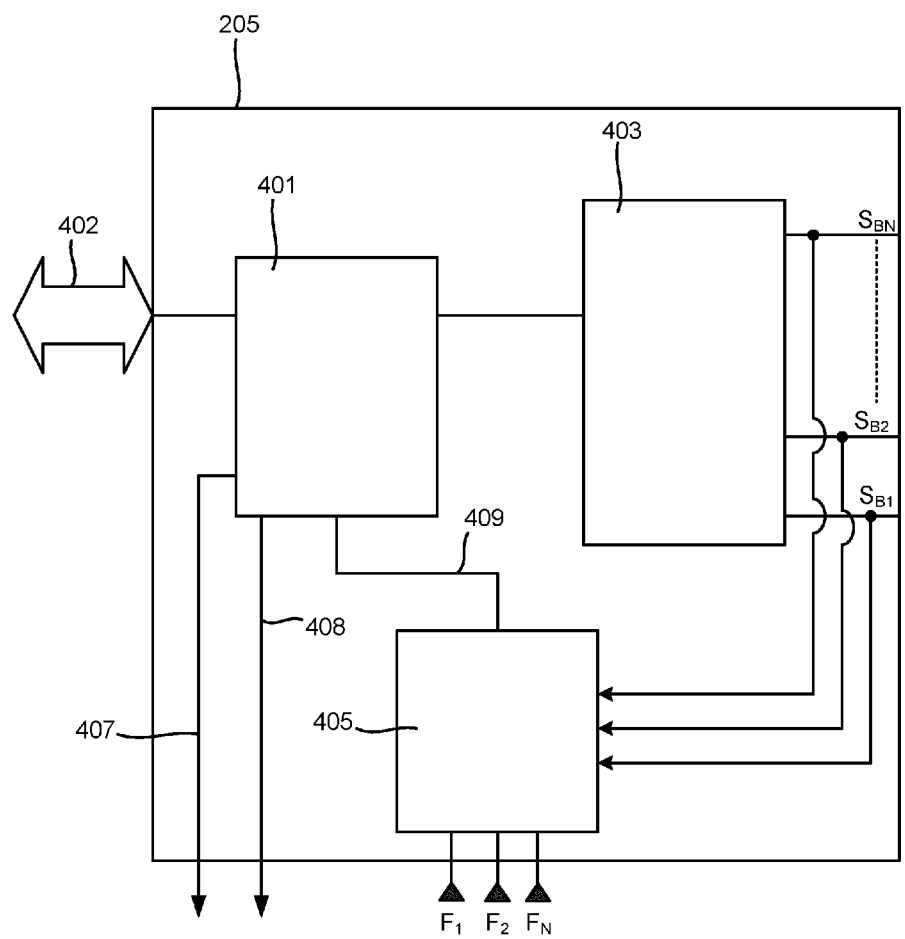
FIG. 4 shows further details of a control unit for use in an apparatus as shown in FIGS. 2 and 3.

FIG. 4 schematically shows further details of the tapering control unit 205 according to an embodiment of the invention. As can be seen in FIG. 4, the tapering control unit 205 comprises a processing unit 401 that is coupled to receive control signals 402 from an OAM unit (not shown). The processing unit 401 is adapted to pass control signals to a tapering section 403 that is arranged to generate the control signals $S_{B1}$ to $S_{BN}$ that provide the bias control of the transmitting units $201_1$ to $201_N$. As described above, the control signals are provided for individually controlling the bias settings, such as the bias levels of the power amplifier $203_1$ to $203_N$, according to a tapering function provided between the feed signals to the antenna elements $207_1$ to $207_N$. The control signals $S_{B1}$ to $S_{BN}$ are therefore determined based on the tapering settings as determined by the system control and OAM unit 215, as described above, and received by the processing unit 401 within the tapering control unit 205.

The processing unit 401 may also be arranged to generate the calibration signals 407 for each of the N antenna elements. The calibration signals may be known calibration signals. Although FIG. 4 only shows a single output path 407 for transmitting the calibration signals to the N adder units of FIG. 3, it should be appreciated that there may be N calibration signal paths, one for each of the N transmitting units $201_1$ to $201_N$.

The processing unit 401 may also be arranged to generate the tapering coefficients 408 for each of the N multiplier units. Although FIG. 4 only shows a single output path 408 for transmitting the tapering coefficients to the N multiplier units of FIG. 3, it should be appreciated that there may be N tapering coefficient signal paths, one for each of the N multiplier units $210_1$ to $210_N$ (these corresponding to the signals $212_1$ to $212_N$ of FIG. 3, or the signals $S_{TS}$ to $S_{TN}$ of FIG. 2).

The tapering control unit 205 further comprises a comparing section 405 that is arranged to compare the feedback signals $F_1$ to $F_N$, received from the transmitting units $201_1$ to $201_N$, as described above, to determine how the observed signals from each transmitting element compare with wanted signals for a given set of control signals $S_{B1}$ to $S_{BN}$.

The result of this comparison 409 is fed into the processing unit 401, which can then be used to regulate the power amplifiers accordingly. For example the result of the comparison can be used to regulate the gain and/or phase of the transmitters. As such, the known calibration signals 407 and the feedback signals $F_1$ to $F_N$ can be used to adjust gain/phase values to take into account the true gain and true circuit parameters or characteristics of each power amplifier.

Figure 5:
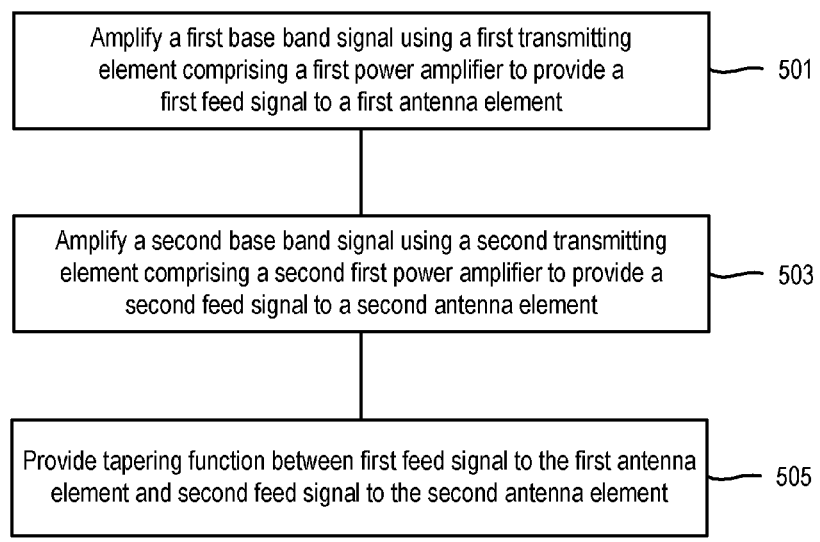
FIG. 5 shows the steps performed by an embodiment of the present invention.

FIG. 5 shows a flow chart illustrating a method according to an embodiment of the preset invention. The method comprises, in step 501 amplifying a first base band signal using a first transmitting element comprising a first power amplifier to provide a first feed signal for a first antenna element. In step 503 a second base band signal amplified using a second transmitting element comprising a second power amplifier to provide a second feed signal to a second antenna element.

At step 505, a tapering function is provided between the first feed signal to the first antenna element and the second feed signal to the second antenna element.

Figure 6:
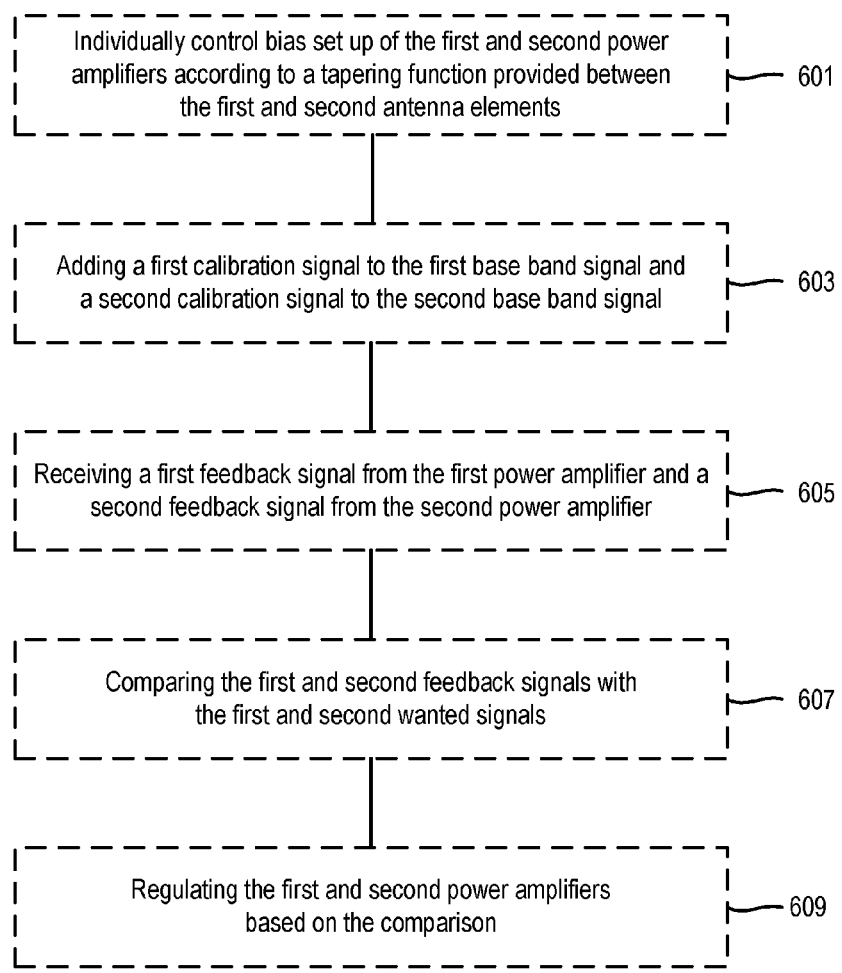
FIG. 6 shows steps that may be performed by further embodiments of the invention.

FIG. 6 show steps that may be performed by other embodiments of the invention. In step 601 the bias settings of the first and second power amplifiers are individually controlled according to a tapering function provided between the first feed signal to the first antenna element and the second feed signal to the second antenna element, as described above. The tapering function between the first and second antenna elements may be created at baseband level.

Optional steps 603 to 609 (which may be provided in addition to step 601, or an alternative thereto, may also be provided if it is desired to use a calibration signal to minimise errors in the observed output of the power amplifiers, for given bias levels of the power amplifiers.

Step 603 comprises adding a first calibration signal to the first base band signal and a second calibration signal to the second base band signal during a calibration mode of operation.

Step 605 comprises receiving a first feedback signal from the output of the first power amplifier and a second feedback signal from the output of the second power amplifier during the calibration mode Step 607 comprises comparing the first and second feedback signals with the first and second wanted signals.

Step 609 comprises regulating the first and second power amplifiers, for example changing the bias settings of the first and second power amplifiers and/or adjusting gain values, based on the comparison of the first and second feedback signals with the first and second wanted signals.

It should be noted that although the above method refers to first and second antenna elements, N antenna elements may be provided with a corresponding number of N steps for each of the N antenna elements and a tapering function provided between the N antenna elements, where N is greater than or equal to two.

Embodiments of the invention describe an apparatus and method to implement an active antenna with integrated power amplifiers provided for each antenna element in order to achieve a flexible amplitude and/or phase tapering of the antenna elements without affecting dynamic performance, linearity and energy efficiency. When using individual transmitters for each antenna element, phase adjustment, either static or semi-static, can be achieved on base band signals on a per user equipment basis, that is whereby different user equipment can be configured in a simple manner to have different tapering functions.

In the RF power amplifiers, the power dissipation and the RF output power capability from the RF power transistor is controlled by means of a bias control. The RF power output capability and the power dissipation for the transistor can thus be controlled by changing the bias point of the power amplifiers. By controlling the bias point of each power amplifier with a control signal that corresponds to digital representations of the bias value required for the power amplifier, it is possible to control the power output capability for a given input feed signal to the power amplifier. In this way, each power amplifier connected to an antenna element can be controlled individually to provide a tapering function while still maintaining power efficiency.

Due to this individual control of each power amplifier it is also possible to set an arbitrary tapering function. It is also possible to regulate the overall RF output power capability from $P_{min}$-$P_{max}$ without affecting the tapering function or the RF power efficiency. The power amplifier output power capability and power efficiency is controlled by means of adjusting the bias setting. Thus, if the power capability of a power amplifier is adjusted between $P_{min}$-$P_{max}$, the power amplifier bias is adjusted to accommodate the new capability setting without affecting the tapering function or the RF power efficiency.

In an embodiment of the present invention, a particular antenna tapering function can be set up at equipment deployment. For example, a column antenna can be set up for a given application, and thereafter operated in this mode of operation. In another embodiment of the present invention, the antenna tapering can be dynamically changed during runtime in order to follow for example traffic changes, rearrangement of cell structure. This involves changing the control signals $S_{B1}$ to $S_{BN}$ (and/or $S_{T1}$ to $S_{TN}$) in dependence on signals from the system control and OAM unit 215, to thereby take account of traffic changes, cell restructure, or other considerations, such that the bias settings are adjusted to reflect a particular tapering function between the separate antenna elements.

Embodiments of the present invention have the advantage of providing flexible tapering whilst maintaining power efficiency. Embodiments of the present invention also have the advantage of not requiring antennas to be exchanged when new antenna patterns are required.

In embodiments of the present invention, the tapering can be changed in runtime based on for example traffic changes or cell rearrangement. This enables antenna performance to be optimized due to traffic situation and network status.

Also, the tapering can be set at deployment of the infrastructure, rather than at the time of manufacture. This enables the tapering to be tailored to the requirements of the system in situ.

In the case that the antenna elements form a matrix antenna, embodiments of the present invention can achieve new antenna beam patterns by applying tapering to parts or the whole matrix antenna elements.

Embodiments of the present invention allow overall RF power regulation to be used by controlling the tapering of the antenna elements in order to maintain overall system efficiency, as the required RF power is a function of traffic demands.

It is noted that in the embodiments described above, each antenna element may be an individual antenna element, or a combination of two or more antenna elements organised into a sub-group of antenna elements.

It is also noted that although the various embodiments show certain circuit element as being directly coupled to each other, other circuit elements, for example filter circuits or isolating circuits may be provided between the various circuit elements, without departing from the scope of the invention as defined in the appended claims.

It is noted that the controlling of the bias settings may also comprise controlling the gate bias of a power amplifier 203, for controlling the gain of the power amplifier. The gain of a power amplifier may also be controlled by an embedded function such as digital pre-distortion or by a calibration process as described above.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An apparatus for feeding an antenna array comprising at least first and second antenna elements, the apparatus comprising:
    a first transmitting element configured to receive a first base band signal and to feed a first feed signal to a first antenna element, the first transmitting element comprising a first power amplifier;
    a second transmitting element configured to receive a second base band signal and to feed a second feed signal to a second antenna element; the second transmitting element comprising a second power amplifier; and
    a tapering control unit adapted to provide a tapering function between the first feed signal to the first antenna element and the second feed signal to the second antenna element,
    wherein the tapering control unit is adapted to provide first and second control signals for individually controlling bias settings of the first power amplifier and the second power amplifier, respectively, according to the tapering function provided between the first and second feed signals, and
    wherein the controlling of bias setting comprises controlling a supply voltage provided to the first power amplifier and the second power amplifier to fit a power capability need created by the tapering function.

2. An apparatus as claimed in claim 1, further comprising: a first biasing circuit for controlling the bias settings of the first power amplifier; a second biasing circuit for controlling the bias settings of the second power amplifier; wherein the first biasing circuit and the second biasing circuit are coupled to receive the first control signal and the second control signal from the tapering control unit, and wherein the first and second control signals are digital signals for controlling the respective biasing circuits.

3. An apparatus as claimed in claim 1, wherein the tapering control unit is adapted to control the bias settings of the first and second power amplifiers to set a power output capability and/or power dissipation of the first and second power amplifiers according to the tapering function.

4. An apparatus as claimed in claim 1, wherein the tapering control unit is configured to dynamically adapt one or more bias settings in response to changes in the characteristics of the tapering function.

5. An apparatus as claimed in claim 1, further comprising: a first multiplier unit provided in the path of the first base band signal; a second multiplier unit provided in the path of the second base band signal; wherein the first multiplier unit and the second multiplier unit are controlled by the tapering control unit, and configured to adjust the amplitude and/or phase of the first base band signal and the second base band signal, respectively, to provide the tapering function between the first feed signal to the first antenna element and the second feed signal to the second antenna element.

6. An apparatus as claimed in claim 1, wherein the tapering control unit is controlled by one or more signals received from an operations, administration and maintenance, OAM, system of a mobile communications system.

7. An apparatus as claimed in claim 1, wherein each transmitting element further comprises a processing circuit for up-converting the first and second feed signals to respective radio frequency signals, for amplification by the respective power amplifier.

8. An apparatus as claimed in claim 1, further comprising: a first adder circuit coupled to a signal flow of the first transmitting element; a second adder circuit coupled to a signal flow of the second transmitting element; wherein the tapering control unit is further adapted to provide first and second calibration signals via the first and second adder circuits to the first and second signal flows during a calibration mode of operation.

9. An apparatus as claimed in claim 8, wherein the tapering control unit is coupled to receive:
a first feedback signal from the output of the first power amplifier;
a second feedback signal from the output of the second power amplifier;
wherein the control unit is further adapted to compare the first and second calibration signals with the first and second feedback signals, during a calibration mode of operation, and to regulate bias settings of the first and second power amplifiers based on the comparison of the first and second feedback signals with the first and second calibration signals.

10. An antenna array comprising a plurality of antenna elements, and an apparatus as claimed in claim 1.

11. A method of providing a tapering function in an antenna array comprising at least first and second antenna elements, the method comprising the steps of:
amplifying a first base band signal using a first transmitting element comprising a first power amplifier, to provide a first feed signal for a first antenna element;
amplifying a second base band signal using a second transmitting element comprising a second power amplifier, to provide a second feed signal for a second antenna element;
providing a tapering function between the first feed signal to the first antenna element and the second feed signal to the second antenna element;
adding a first calibration signal to the first feed signal and a second calibration signal to the second feed signal during a calibration mode of operation;
receiving a first feedback signal from the output of the first power amplifier and a second feedback signal from the output of the second power amplifier during the calibration mode;
comparing the first and second calibration signals with the first and second feedback signals, during a calibration mode of operation; and
regulating the bias settings of the first and second power amplifiers based on the comparison of the first and second feedback signals with the first and second calibration signals.

12. A method as claimed in claim 11, wherein the step of providing the tapering function further comprises the step of individually controlling bias settings of the first power amplifier and the second power amplifier according to the tapering function provided between the first antenna element and the second antenna element.

13. A method as claimed in claim 12, wherein the bias settings of the first power amplifier and the second power amplifier are dynamically controlled during use of the antenna array.

14. A method as claimed in claim 13, where in the bias settings are controlled according to information received from a mobile communications system.

15. A method as claimed in claim 11, further comprising the steps of: adjusting the amplitude and/or phase of the first feed signal and the second feed signal to provide the tapering function between the first feed signal to the first antenna element and the second feed signal to the second antenna element.

* * * * *